(12) United States Patent
Ha et al.

(10) Patent No.: US 6,391,673 B1
(45) Date of Patent: May 21, 2002

(54) METHOD OF FABRICATING MICRO ELECTRO MECHANICAL SYSTEM STRUCTURE WHICH CAN BE VACUUM-PACKED AT WAFER LEVEL

(75) Inventors: Byeoung Ju Ha; Seog-soon Baek, both of Suwon; Hyun-cheol Kim; Hoon Song, both of Seoul; Yong-soo Oh, Seongnam, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/702,849

(22) Filed: Nov. 1, 2000

(30) Foreign Application Priority Data

Nov. 4, 1999 (KR) ............................. 99-48592

(51) Int. Cl.⁷ ............................................. H01L 21/00
(52) U.S. Cl. ............................. 438/51; 438/55; 438/64
(58) Field of Search ............................. 438/64, 55, 51, 438/106, 119, 118, 125, 107, 455, 446, 689, 149, 105; 251/129.04

(56) References Cited

U.S. PATENT DOCUMENTS

| | | | | |
|---|---|---|---|---|
| 5,839,722 A | * | 11/1998 | Berlin et al. | 271/265.02 |
| 5,846,396 A | * | 12/1998 | Zanzucchi et al. | 204/601 |
| 5,877,580 A | * | 3/1999 | Swierkowski | 310/328 |
| 5,907,768 A | * | 5/1999 | Malta et al. | 438/105 |
| 6,033,544 A | * | 3/2000 | Demers et al. | 204/405 |
| 6,060,336 A | * | 5/2000 | Wan | 438/50 |
| 6,071,819 A | * | 6/2000 | Tai et al. | 438/694 |
| 6,090,687 A | * | 7/2000 | Merchant et al. | 438/455 |
| 6,096,433 A | * | 8/2000 | Kikuchi | 428/446 |
| 6,123,316 A | * | 9/2000 | Biegelsen et al. | 251/129.01 |
| 6,142,358 A | * | 11/2000 | Cohn et al. | 228/44.7 |
| 6,146,979 A | * | 11/2000 | Henley et al. | 438/458 |
| 6,153,524 A | * | 11/2000 | Henley et al. | 438/691 |

FOREIGN PATENT DOCUMENTS

| | | |
|---|---|---|
| KR | 99-27113 | 4/1999 |
| KR | 99-51063 | 7/1999 |

* cited by examiner

*Primary Examiner*—David Nelms
*Assistant Examiner*—Thao P Le
(74) *Attorney, Agent, or Firm*—Burns, Doane, Swecker & Mathis, L.L.P.

(57) ABSTRACT

A method of fabricating a micro electromechanical system (MEMS) structure which can be vacuum-packaged at the wafer level is provided. The method includes the steps of forming a multilayered stack including a signal line on a first wafer; bonding a second wafer to the multilayered stack; polishing the first wafer to a predetermined thickness; forming a MEMS structure in a vacuum area of the first wafer and a pad outside the vacuum area, the MEMS structure and the pad being connected to the signal line; forming a structure in a third wafer to have space corresponding to the vacuum area of the MEMS structure; and bonding the third wafer to the polished surface of the first wafer in a vacuum state. For protection of the structure and maintaining a vacuum level required for operation, the fabricated structure is vacuum-packaged at the wafer level, thereby improving the yield of fabrication. In addition, since a special vacuum packaging process is not necessary, the fabrication can be simplified.

17 Claims, 9 Drawing Sheets

METHOD OF FABRICATING MICRO ELECTRO MECHANICAL SYSTEM STRUCTURE WHICH CAN BE VACUUM-PACKED AT WAFER LEVEL

BACKGROUND OF THE INVENTION

1. Field of the Invention

The present invention relates to a method of fabricating a micro electro mechanical system (MEMS) structure which can be vacuum-packaged at the wafer level.

2. Description of the Related Art

In the case of surface micromachining most widely used in fabricating MEMS structures, polysilicon is used as the material for the structure. Here, residual stress existing in the poly silicon has a negative influence on a completed MEMS structure. Moreover, it is difficult to fabricate a structure having a thickness greater than 10 μm with general polysilicon taking into consideration the fabrication processes that are available. To solve this problem, a process of using SOI or a result obtained by bonding single crystalline silicon to glass to a thickness of 40 μm as a structure layer has been used. Although this process can realize a structure which is thick and does not have residual stress, it is difficult to form more than one structure layer. Consequently, a complex structure cannot be formed through this process. In the case of bulk micromachining that forms a MEMS structure using single crystalline anisotropic etching, it is difficult to form a structure having a high aspect ratio due to the characteristic of anisotropic etching.

In resonance type gyroscopes among MEMS structures, the Q-factor is vulnerable to the surrounding vacuum level during resonance. For this reason, fabricated MEMS structures should be packaged in a vacuum state through complex processes. Additionally, it is difficult to apply a general IC/ASIC packaging process to chips having a MEMS structure. Therefore, it is difficult to realize automization of the fabrication process.

SUMMARY OF THE INVENTION

To solve the above problems, it is a first object of the present invention to provide a method of fabricating a micro electro mechanical system (MEMS) structure, which can easily form a vacuum structure.

It is a second object of the present invention to provide a method of fabricating a MEMS structure which can be vacuum-packaged at the wafer level.

It is a third object of the present invention to provide a method of fabricating a MEMS structure which has a pad in itself so that it can be installed in a circuit board.

Accordingly, to achieve the above objects of the invention, in one embodiment, there is provided a method of fabricating a MEMS structure which can be vacuum-packaged at the wafer level. The method includes a first step of forming a multilayered stack including a signal line on a first wafer; a second step of bonding a second wafer to the multilayered stack; a third step of polishing the first wafer to a predetermined thickness; a fourth step of forming a MEMS structure in a vacuum area of the first wafer and a pad outside the vacuum area, the MEMS structure and the pad being connected to the signal line; a fifth step of forming a structure in a third wafer to have space corresponding to the vacuum area of the MEMS structure; and a sixth step of bonding the third wafer to the polished surface of the first wafer in a vacuum state.

The fourth step preferably includes a sub-step of forming a signal line layer for connecting the inner area to the pad while the MEMS structure is being stacked.

In the sixth step, the third wafer is bonded to the first wafer using an adhesive, or the third wafer is directly bonded to the first wafer by silicon direct bonding (SDB), anodic bonding or eutectic bonding.

The third wafer is preferably formed of single crystalline silicon. In the fifth step, the third wafer is preferably processed by an anisotropic etching method.

In another embodiment, there is provided a method of fabricating a MEMS structure which can be vacuum-packaged at the wafer level. The method includes a first step of forming a sacrificial layer having a predetermined pattern on a first wafer; a second step of forming a poly silicon layer having a predetermined pattern for a signal line on the sacrificial layer; a third step of forming an insulation layer on the poly silicon layer; a fourth step of bonding a second wafer to the insulation layer; a fifth step of polishing the first wafer to a predetermined thickness; a sixth step of forming a MEMS structure comprising a resonant plate and a frame supporting the resonant plate in a vacuum area of the first wafer and a pad outside the vacuum area, the MEMS structure and the pad being connected to the signal line; a seventh step of forming a structure in a third wafer to have space corresponding to the vacuum area of the MEMS structure; and an eighth step of bonding the third wafer to the polished surface of the first wafer in a vacuum state.

In the eighth step, the third wafer is bonded to the first wafer using an adhesive, or the third wafer is directly bonded to the first wafer by silicon direct bonding or anodic bonding.

The first wafer is preferably formed of single crystalline silicon. In the seventh step, the third wafer is preferably processed by an anisotropic etching method.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Hereinafter, embodiments of a method of fabricating a micro electromechanical system (MEMS) structure according to the present invention will be described in detail with reference to the attached drawings.

An example of a method of fabricating a microgyroscope having a MEMS structure will be described. In particular, a method of forming a vacuum structure at the wafer level will be described.

Figure 1:
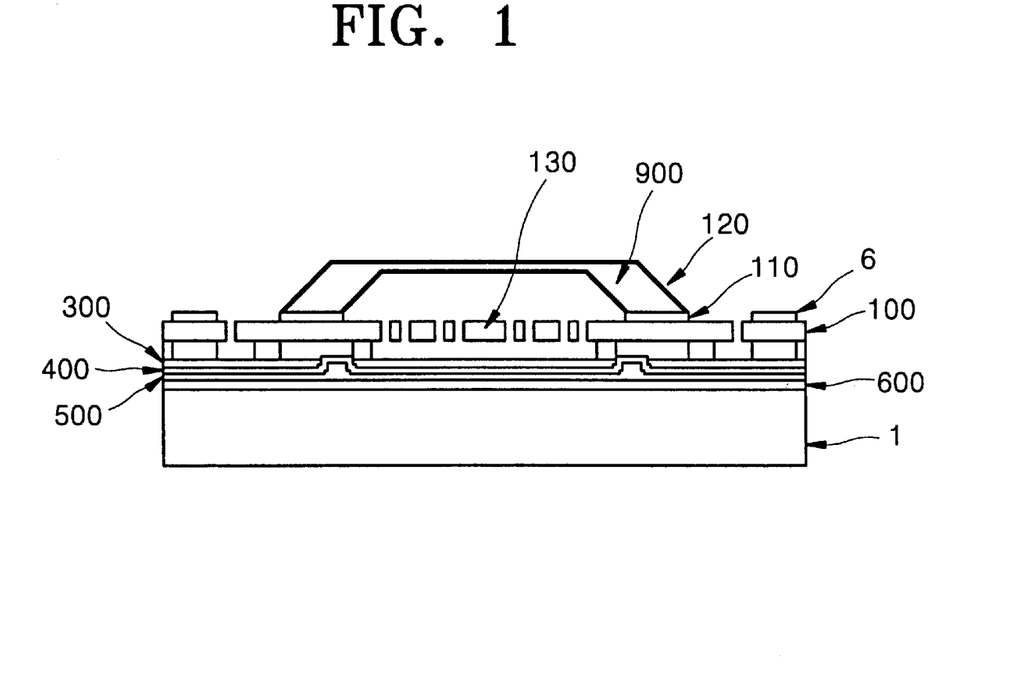
FIG. 1 is a schematic cross-sectional view illustrating a microgyroscope completed according to the present invention.
Figure 2:
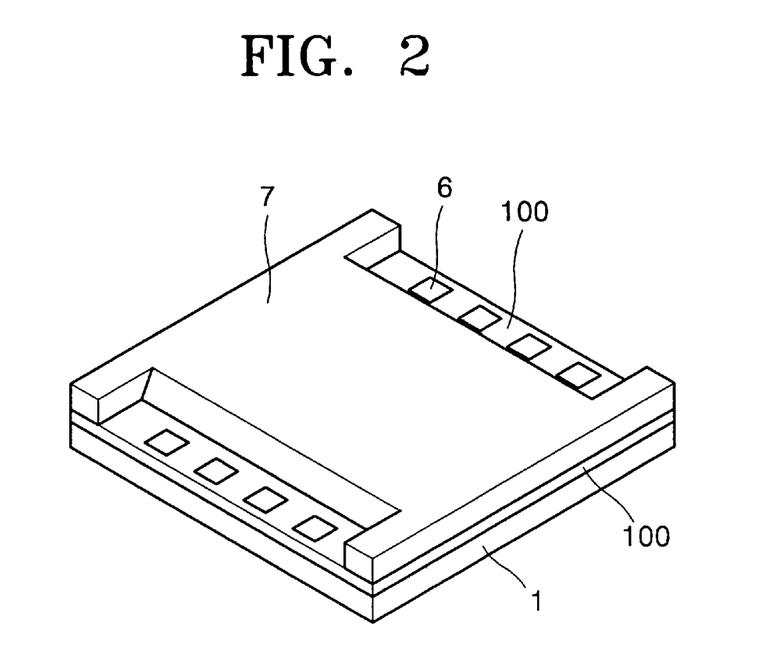
FIG. 2 is a schematic perspective view illustrating a microgyroscope completed according to the present invention.
Figure 3:
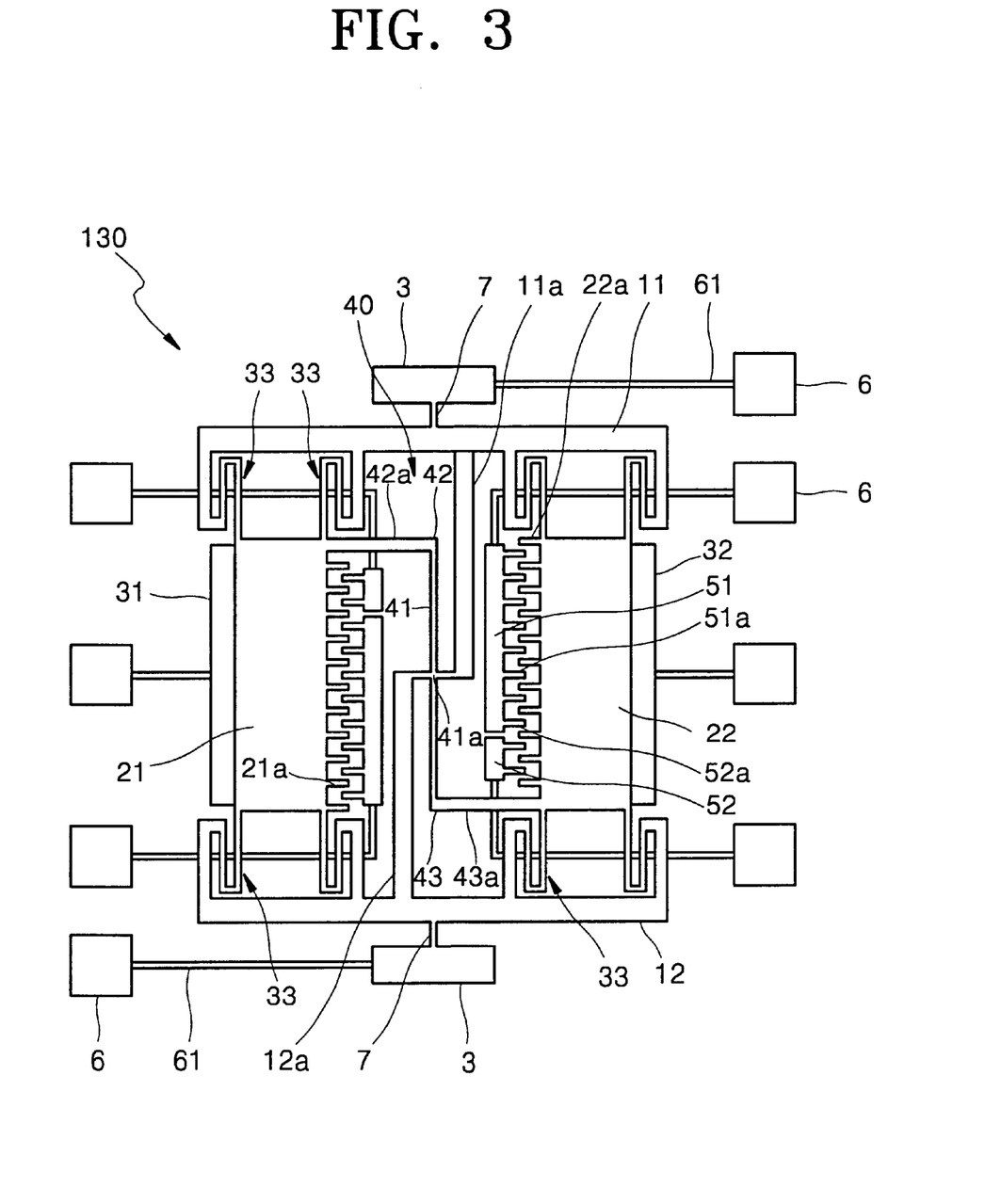
FIG. 3 is a sectional plan view illustrating the internal resonance structure of a microgyroscope completed according to the present invention.
Figure 4:
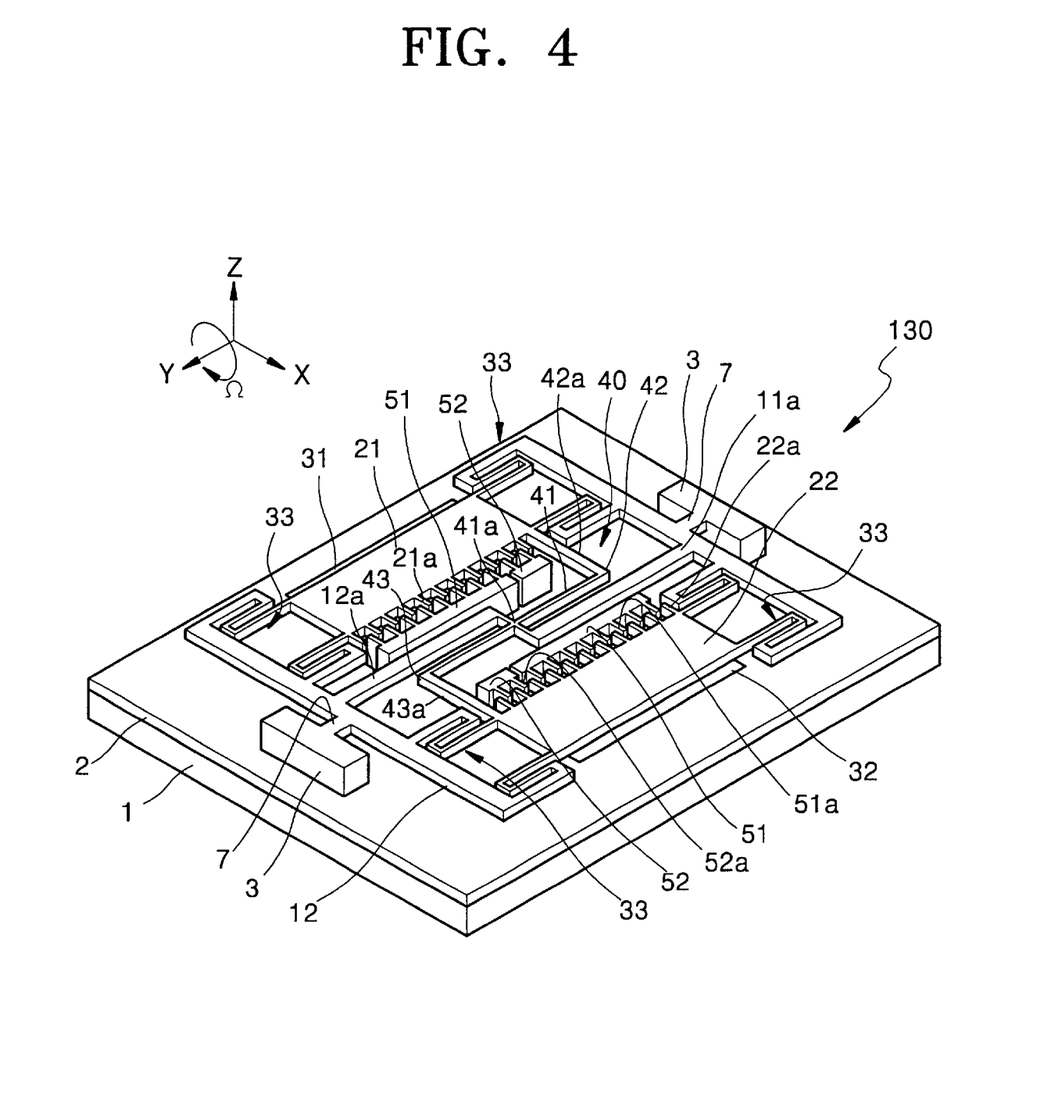
FIG. 4 is a schematic perspective view illustrating the resonance structure of a microgyroscope completed according to the present invention.

The following description concerns the structure of a microgyroscope fabricated using a completed MEMS structure. FIG. 1 is a schematic cross-sectional view illustrating a completed microgyroscope. FIG. 2 is a schematic perspective view illustrating a microgyroscope. FIG. 3 is a sectional plan view illustrating the internal resonance structure of a microgyroscope. FIG. 4 is a schematic perspective view illustrating the resonance structure of a microgyroscope.

Referring to FIGS. 1 and 2, a resonance structure subjecting to a MEMS structure and pads 6 electrically connected to the resonance structure are formed on a first substrate 1. A cap 900 is bonded to an adhesive layer 110 so that it is positioned above the center portion of the MEMS structure, that is, a portion requiring a vacuum state. Reference numeral 130 denotes a structure including resonant plates and frames supporting them which will be described later. Reference numeral 100 denotes a second substrate used when the MEMS structure is formed. A plurality of pads 6 are provided on the second substrate 100 that is not covered with the cap 900.

Referring to FIGS. 3 and 4, an insulation layer 2 is formed on a substrate 1, and a resonance structure 130 is formed above the insulation layer 2. The resonance structure 130 includes first and second frames 11 and 12 which are supported by anchors 3 to be parallel to each other and first and second resonant plates 21 and 22 between the first and second frames 11 and 12.

A sensing beam 7 is provided between each of the first and second frames 11 and 12 and a corresponding anchor 3. The sensing beams 7 serve as torsion springs with respect to the motion of the first and second frames 11 and 12.

The first and second resonant plates 21 and 22 are supported by driving beams 33 for a resonant mode. The driving beams 33 serve as springs connected to the first and second frames 11 and 12. As shown in the drawings, none of the driving beams 33 are in a straight line, but rather extends in the X and Y directions to allow the first and second resonant plates 21 and 22 to effectively resonate. Such a structure is optional. Like conventional gyroscopes, the driving beam 33 may be extended in the Y direction to be in a straight line. In particular, the driving beams 33 are preferably extended from the four corners of each of the first and second resonant plates 21 and 22.

Sensing electrodes 31 and 32 are formed on the insulation layer 2 below the first and second resonant plates 21 and 22, respectively. The sensing electrodes 31 and 32 form condensers (or capacitors) together with the respective first and second resonant plates 21 and 22.

A matching link 40 is provided between the first and second resonant plates 21 and 22. The matching link 40 is connected to the first and second resonant plates 21 and 22 so that the motion of one resonant plate is linked to the motion of the other resonant plate such that the matching link 40 is moved by the motion of one resonant plate in a first direction and then moves the other resonant plate in a second direction opposite to the first direction.

For example, when the first resonant plate 21 moves toward the matching link 40, the matching link 40 moves the second resonant plate 22 toward itself. On the other hand, when the first resonant plate 21 moves away from the matching link 40, the matching link 40 moves the second resonant plate 22 away from itself.

The link between the two resonant plates 21 and 22 allows the resonance frequencies of the resonant plates 21 and 22 to be the same. In actual tests, the two resonant plates 21 and 22 had the same resonance frequency due to the matching link 40. The matching link 40 has a seesaw structure, as shown in FIGS. 3 and 4, and includes an actuating rod 41 of which the center portion 41a is fixed, a first connecting portion 42a extended from one end 42 of the actuating rod 41 and connected to the first resonant plate 21, and a second connecting portion 43a extended from the other end 43 of the actuating rod 41 and connected to the second resonant plate 22. The center portion 41a of the actuating rod 41 is steadily sustained by first and second sub frames 11a and 12a which are extended from the centers of the first and second frames 11 and 12, respectively.

A driving comb electrode 51 for inducing the resonance of each of the resonant plates 21 and 22 and a driving sensing comb electrode 52 for sensing the resonance of each of the resonant plates 21 and 22 are provided between each of the resonant plates 21 and 22 and the matching link 40.

Electrodes 21a, 22a, 51a and 52a alternating with each other in a comb-like shape are formed at the edges of the driving comb electrode 51 and the driving sensing comb electrode 52 and the edges of the first and second resonant plates 21 and 22, facing each other. The electrodes having a comb-like shape provide a resonance force for the first and second resonant plates 21 and 22 due to the electrostatic force therebetween.

In FIG. 3, reference numeral 61 denotes signal lines connected to the electrodes, and reference numeral 6 denotes pads for connecting the signal lines 61 to the outside. The signal lines and the pads are not shown in FIG. 4.

The following description concerns the steps of a method of fabricating a microgyroscope having such a structure. Drawings related to the steps of the method schematically illustrate the resulting structures of the steps.

Figure 5:
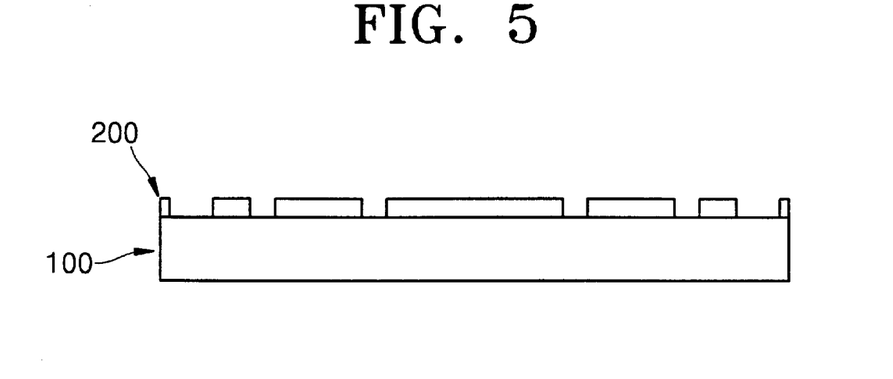
FIGS. 5 through 15 are views illustrating a method of fabricating a microgyroscope according to the present invention.

As shown in FIG. 5, TEOS is deposited on an N-type first wafer 100, thereby forming a sacrificial layer 200. Then, the sacrificial layer 200 is patterned in a predetermined pattern. The first wafer 100 is formed of a single silicon having a resistivity of 0.01 $\Omega/cm^2$ and will be used as a structure layer.

Figure 6:
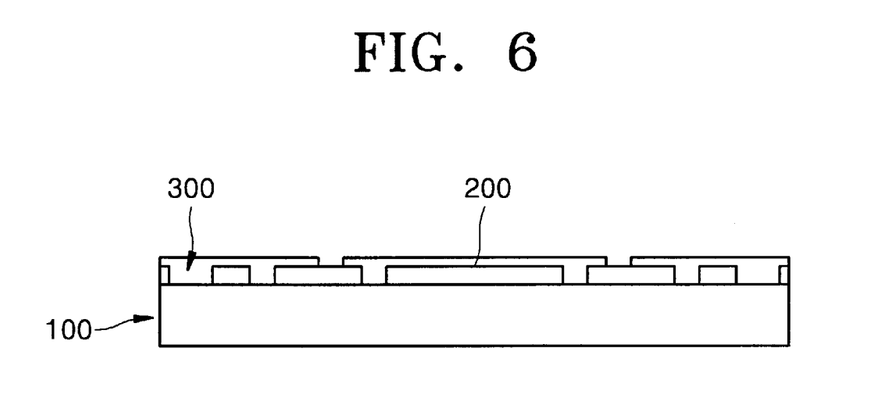

As shown in FIG. 6, polysilicon is deposited on the sacrificial layer 200 by a low pressure chemical vapor deposition (LPCVD) method, thereby forming a feed through layer 300 in a predetermined pattern. The feed through layer 300 corresponds to the signal line 61.

Figure 7:
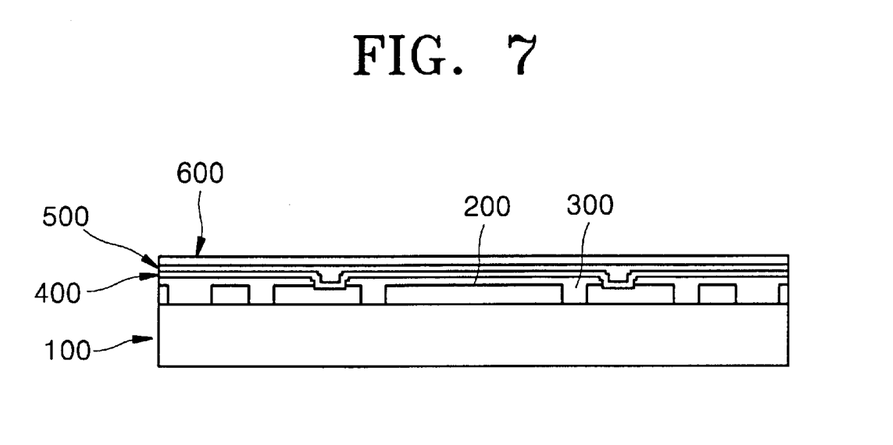

As shown in FIG. 7, a silicon nitride layer 400, a silicon oxide layer 500 and an epitaxial silicon layer 600 are sequentially formed on the feed through layer 300.

Figure 8:
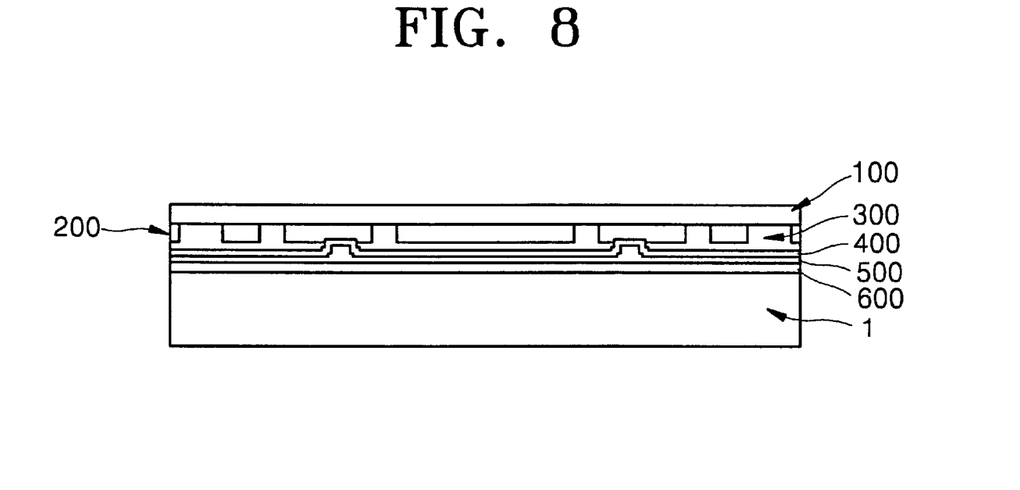

As shown in FIG. 8, the first wafer 100 is polished to a thickness of about 40 $\mu$m. A substrate 1, as a second silicon wafer, is bonded to the epitaxial silicon layer 600 by silicon direct bonding (SDB).

Figure 9:
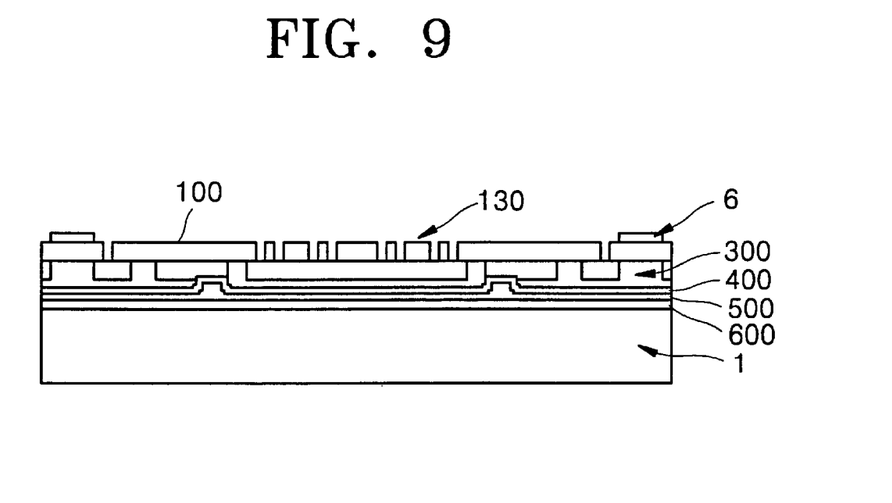

As shown in FIG. 9, pads 6 are formed of Cr/Au so that they are electrically connected to the feed through layer 300, that is, the signal line 61. Thereafter, the first wafer 100 is etched by reactive ion etching (RIE), thereby forming a resonance structure 130 described above.

Figure 10:
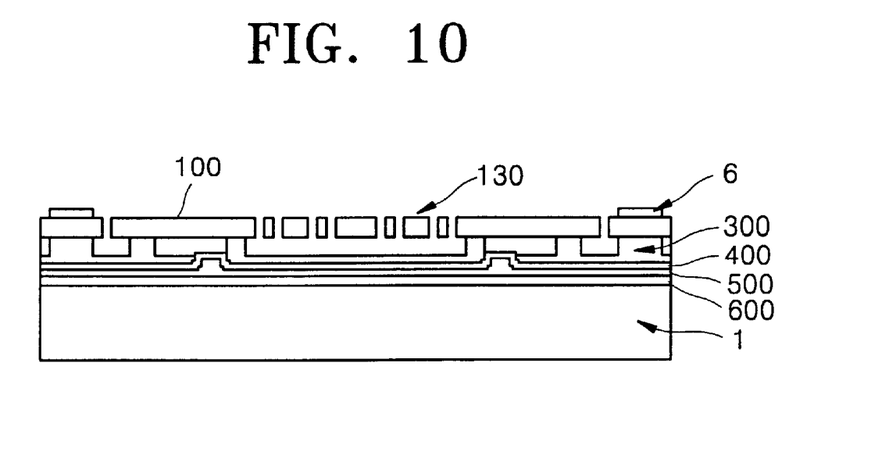

As shown in FIG. 10, the sacrificial layer 200 is removed by a wet etching method using HF, thereby releasing the resonance structure 130.

Figure 11:
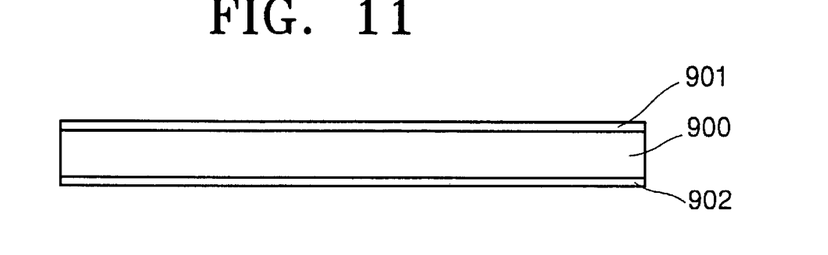

As shown in FIG. 11, a first mask layer 901 and a second mask layer 902 are formed on the top and the bottom, respectively, of a separately prepared third wafer 900.

Figure 12:
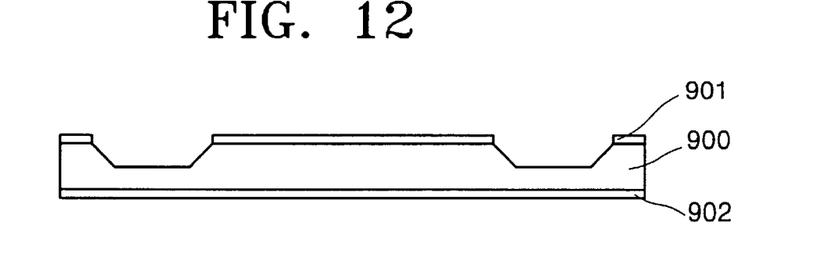

As shown in FIG. 12, the first mask layer 901 corresponding to both outer sides of the resonance structure 130 is removed by etching. Thereafter, the third wafer 900 exposed without being covered with the first mask layer 901 is etched to a predetermined depth.

Figure 13:
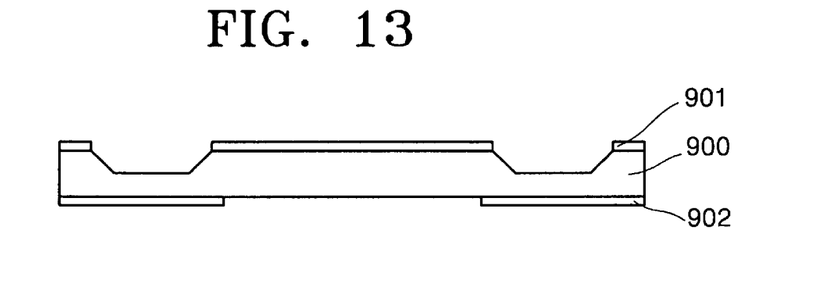

As shown in FIG. 13, the second mask layer 902 corresponding to the resonance structure 130 is removed by etching, thereby exposing the bottom of the third wafer 900 corresponding to the resonance structure 130.

Figure 14:
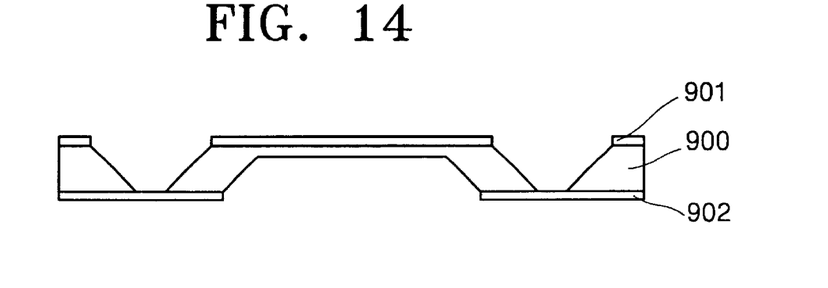

As shown in FIG. 14, the exposed third wafer 900 that is not covered with either the first mask layer 901 or the second mask layer 902 is etched by an anisotropic etching method.

Figure 15:
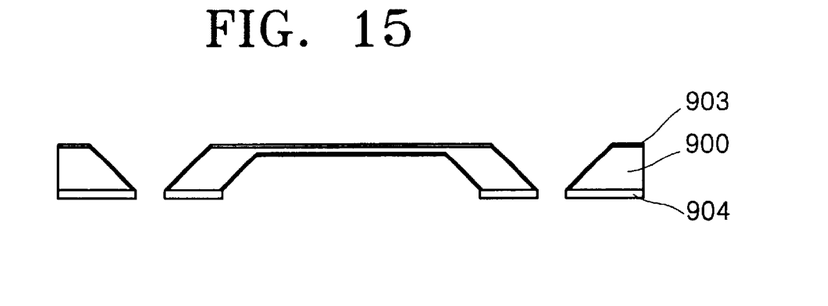
Figure 16:
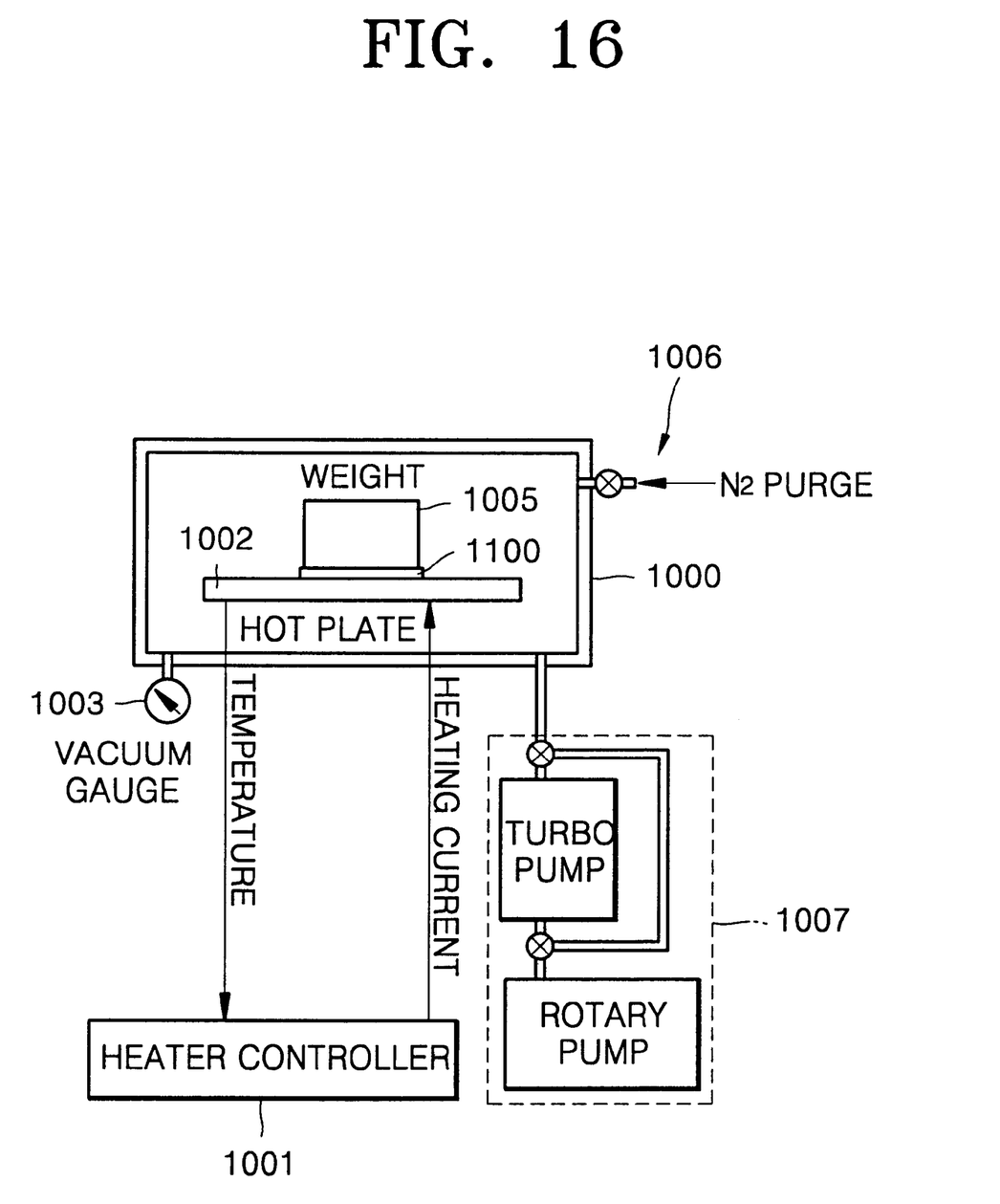
FIG. 16 is a schematic diagram illustrating the configuration of a vacuum chamber used in a method according to the present invention.

As shown in FIG. 15, the first and second mask layers 901 and 902 are removed. Thereafter, an oxide film 903 is formed on the entire surface of the third wafer 900. Next, the bottom of the third wafer 900 is coated with a melted glass adhesive 904 such as glass frit. Thereafter, the resultant structure is mounted above the resonance structure 130 formed on the first wafer 100 and then put into a vacuum chamber in which a pressure 3 MPa/cm$^2$ is maintained, as shown in FIG. 16. In the vacuum chamber, the adhesive 904 is hardened at a temperature of 400–600° C., thereby obtaining the microgyroscope shown in FIG. 1. Here, the first wafer 100 and the third wafer 900 may be bonded to each other using the adhesive 904, as described above, or they may be bonded by eutectic bonding using gold, SDB or anodic bonding.

In the configuration of a vacuum chamber 1000 of FIG. 16, a hot plate 1002 on which a product 1100, as shown in FIG. 1, fabricated through the above steps is mounted, is provided within the vacuum chamber 1000 equipped with a vacuum gauge 1003. The hot plate 1002 is connected to an external heater controller 1001. A weight 1005 for pressing the product 1100 is installed above the product 1100. A purge gas inlet 1006 for injecting purge gas and an exhauster 1007 including a turbo pump and a rotary pump are connected to the vacuum chamber 1000. The hot plate 1002 is heated by heating current from the heater controller 1001, and the temperature of the hot plate 1002 is adjusted by the heater controller 1001.

Figure 17:
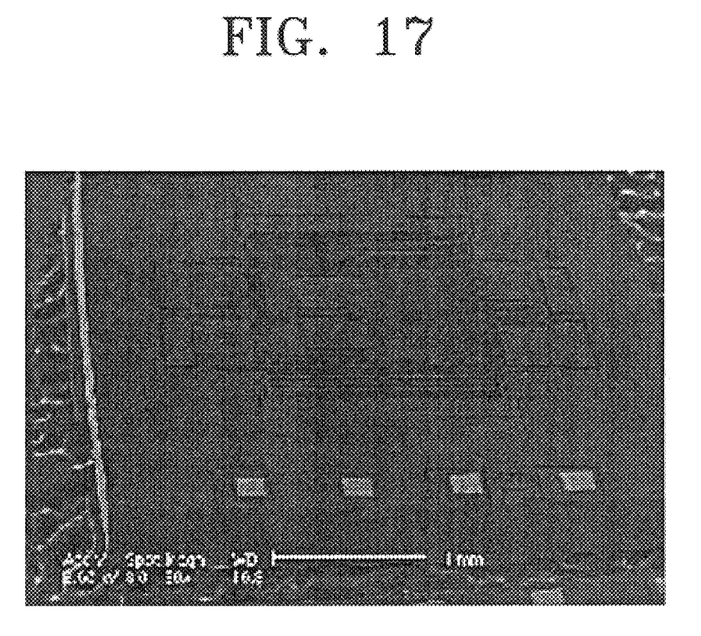
FIG. 17 is a photograph illustrating a microgyroscope according to the present invention, where a cap structure is not installed.
Figure 18:
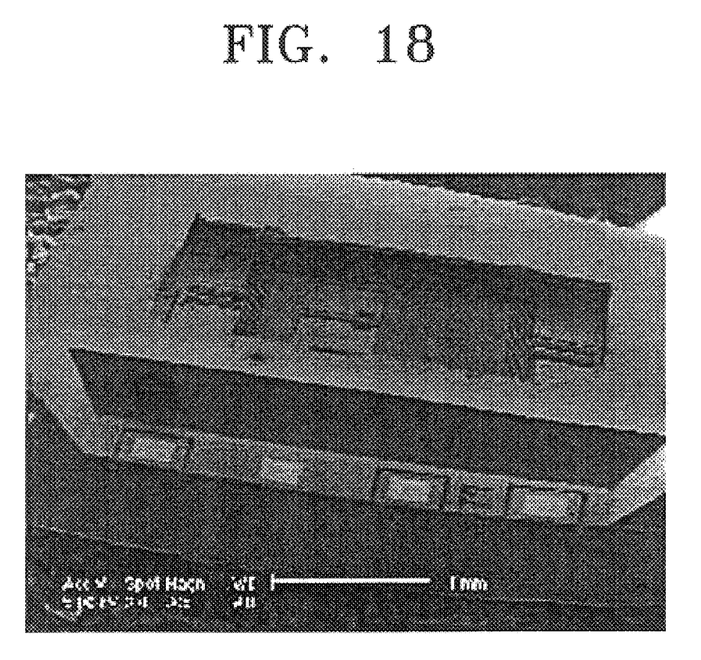
FIG. 18 is a photograph illustrating a microgyroscope according to the present invention, where a cap portion is partially cut away.

FIG. 17 is a photograph illustrating a microgyroscope in which a cap structure formed using the third wafer 900 is not installed. FIG. 18 is a photograph illustrating a completed microgyroscope, the cap structure of which is partially cut away.

Figure 19:
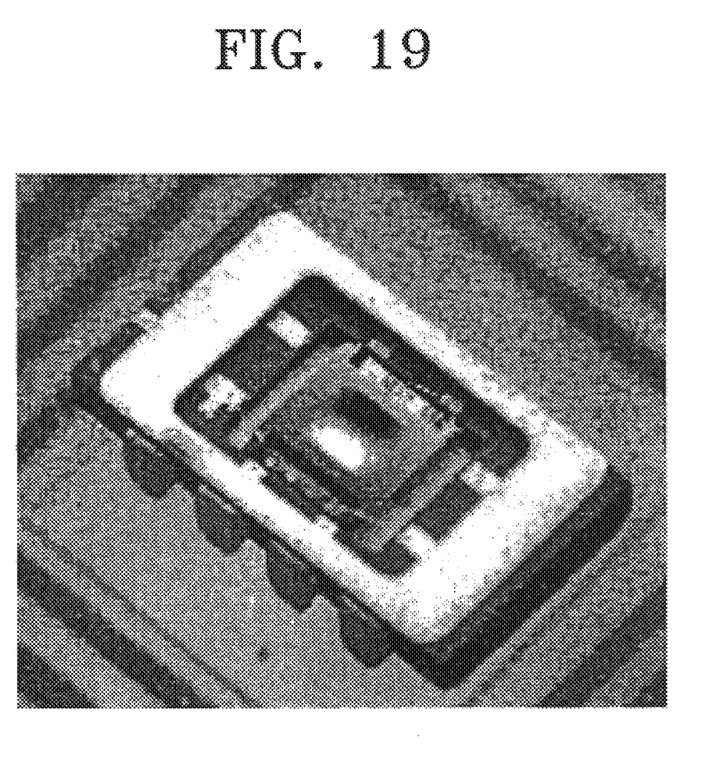
FIG. 19 is a photograph illustrating a module mounted with a microgyroscope completed according to the present invention.
Figure 20:
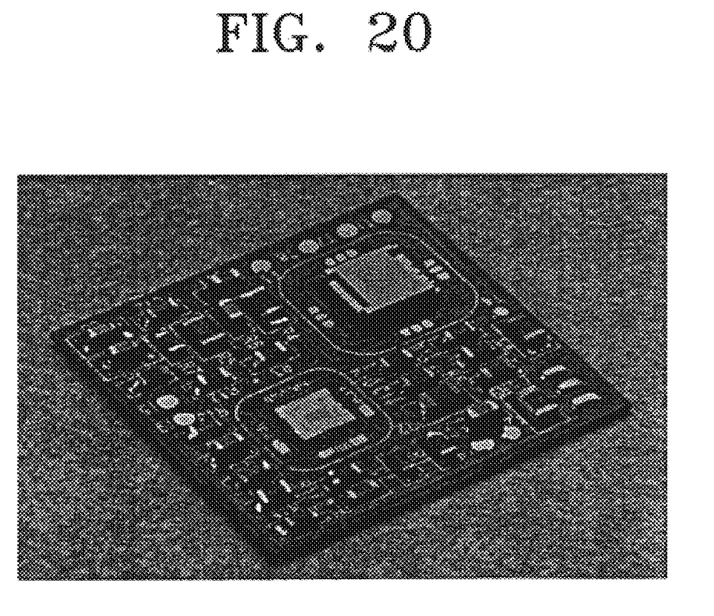
FIG. 20 is a photograph illustrating a circuit board on which a microgyroscope completed according to the present invention is directly mounted.

FIG. 19 is a photograph illustrating a module mounted with a completed microgyroscope. FIG. 20 is a photograph illustrating a circuit board on which a completed microgyroscope is directly mounted. Since pads are provided in a MEMS structure according to the present invention, it is not necessary to make a microgyroscope into an individual module, as shown in FIG. 19, but a microgyroscope can be directly mounted on a circuit board, as shown in FIG. 20.

The present invention has been described focusing on a method of fabricating a microgyroscope, but the present invention can also be applied to fabrication of other devices which have a MEMS structure and require vacuum packaging.

A fabrication method according to the present invention includes the steps of forming a multilayered stack including a signal line on a first wafer; bonding a second wafer to the multilayered stack; polishing the first wafer to a predetermined thickness; forming a MEMS structure in a vacuum area of the first wafer and pads outside the vacuum area, which are connected to the signal line; forming a structure in a third wafer to have space corresponding to the vacuum area of the MEMS structure; bonding the third wafer to the polished surface of the first wafer in a vacuum state; obtaining a MEMS structure having the signal line and pads on the first wafer and polishing the first wafer to a predetermined thickness; obtaining a structure for vacuum packaging from the second wafer; and bonding the second wafer to the polished surface of the first wafer in a vacuum state.

Here, in the step of forming the MEMS structure, a desired MEMS structure can be formed for fabricating a gyroscope, as described above, or other sensors. Such a MEMS structure has a shape similar to that shown in FIG. 2. A structure having a particular function can be formed in a vacuum area within the MEMS structure.

According to the present invention, a MEMS structure having multiple layers can be fabricated in one wafer using semiconductor fabrication processes. Unlike a conventional process using polysilicon, single crystalline silicon is used in the present invention, thereby solving the problem of residual stress caused by polysilicon. Conventionally, the thickness of a structure formed of polysilicon is restricted to 2–10 $\mu$m taking into account fabrication processes. However, according to the present invention, a thick structure having a thickness of 10 $\mu$m or more can be fabricated. In addition, a structure having a high aspect ratio of 20:1 or higher can be fabricated using deep RIE. For protection of the structure and maintaining a vacuum level required for operation, a fabricated structure is vacuum-packaged at the wafer level, thereby improving the yield of fabrication. Since a special vacuum packaging process is not necessary, the fabrication can be simplified.

According to the present invention using single crystalline silicon for a structure layer, a sensor or an actuator can be prevented from being unstable due to residual stress. Since an appropriately thick structure can be formed, a heavy resonance structure having a large Q-factor can be realized. In addition, unlike a SOI process, a complex structure having multiple layers can be easily formed. Moreover, since a feed through layer, that is, a signal line is formed under the structure, wafer level vacuum packaging is allowed. In particular, since a hole for interconnection is not formed, leakage of air due to the hole can be prevented. As described above, since wafer level vacuum packaging is allowed, a conventional semiconductor packaging technique can be used as it is, thereby removing a special vacuum packaging process. Moreover, since a MEMS structure according to the present invention is provided with pads therein, modulization where a chip is installed into a case is not necessary, and the MEMS structure can be directly mounted on a circuit board.

Although the invention has been described with reference to particular embodiments, the embodiments should be construed in a descriptive sense only. It will be apparent to one of ordinary skill in the art that modifications of the described embodiment may be made without departing from the scope of the invention as defined by the attached claims.

What is claimed is:

1. A method of fabricating a micro electro mechanical system (MEMS) structure which can be vacuum-packaged at the wafer level, the method comprising the steps of:
   i. forming a signal line on a first wafer;
   ii. bonding a second wafer to the first wafer to form a multilayered stack;
   iii. forming a MEMS structure in a vacuum area of the first wafer in a vacuum state;
   iv. forming a structure in a third wafer to have space corresponding to the vacuum area of the MEMS structure; and
   v. bonding the third wafer to a surface of the first wafer in a vacuum state.

2. The method of claim 1, wherein the MEMS structure forming step comprises a step of forming a signal line layer for connecting the inner area to the pad.

3. The method of claim 1, wherein the step of bonding the third wafer to the first wafer, includes one of an adhesive or eutectic bonding.

4. The method of claim 1, wherein the step of bonding, the third wafer to the first wafer, includes one of silicon direct bonding or anodic bonding.

5. The method of claim 1, wherein in the step of bonding the third wafer to the first wafer includes eutectic bonding.

6. The method of claim 1, wherein the third wafer is formed of single crystalline silicon.

7. The method of claim 6, wherein the step of forming a structure in the third wafer, includes anisotropic etching.

8. A method of fabricating a micro electro mechanical system (MEMS) structure which can be vacuum-packaged at the wafer level, the method comprising the steps of:
   i. forming a poly silicon layer having a predetermined pattern for a signal line on the sacrificial layer;
   ii. forming a poly silicon layer having a predetermined pattern for a signal line on the sacrificial layer;
   iii. forming an insulation layer on the poly silicon layer;
   iv. bonding a second wafer to the insulation wafer;
   v. forming a MEMS structure comprising a resonant plate and a frame supporting the resonant plate in a vacuum area of the first wafer and a pad outside the vacuum area, the MEMS structure and the pad being connected to the signal line;
   vi. forming a structure in a third wafer to have space corresponding to the vacuum area of the MEMS structure; and
   vii. bonding the third wafer to the polished surface of the first wafer in a vacuum state.

9. The method of claim 8, wherein the step of bonding the third wafer to the first wafer, includes one of an adhesive or eutectic bonding.

10. The method of claim 8, wherein the step of bonding, the third wafer to the first wafer, includes one of silicon direct bonding or anodic bonding.

11. The method of claim 8, wherein the first wafer is formed of single crystalline silicon.

12. The method of claim 11, wherein the step of forming a structure on the third wafer includes anisotropic etching.

13. The method of claim 9, wherein the first wafer is formed of single crystalline silicon.

14. The method of claim 10, wherein the first wafer is formed of single crystalline silicon.

15. The method of claim 1, further including the step of polishing the first wafer to a predetermined thickness.

16. The method of claim 8, further including the step of polishing the first wafer to a predetermined thickness.

17. The method of claim 8, wherein the step of bonding the third wafer to the first wafer includes eutectic bonding.

* * * * *